(12) United States Patent
Kawakami et al.

(10) Patent No.: US 8,339,613 B2
(45) Date of Patent: Dec. 25, 2012

(54) MAKING METHOD OF SAMPLE FOR EVALUATION OF LASER IRRADIATION POSITION AND MAKING APPARATUS THEREOF AND EVALUATION METHOD OF STABILITY OF LASER IRRADIATION POSITION AND EVALUATION APPARATUS THEREOF

(75) Inventors: Ryusuke Kawakami, Kanagawa (JP); Miyuki Masaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/428,297

(22) Filed: Mar. 23, 2012

(65) Prior Publication Data

US 2012/0184055 A1  Jul. 19, 2012

Related U.S. Application Data

(63) Continuation of application No. 13/279,559, filed on Oct. 24, 2011, now Pat. No. 8,144,341, which is a continuation of application No. 12/361,284, filed on Jan. 28, 2009, now Pat. No. 8,045,184.

(30) Foreign Application Priority Data

Feb. 7, 2008 (JP) ................................. 2008-027735

(51) Int. Cl.
*G01B 11/14* (2006.01)
(52) U.S. Cl. ........ 356/615; 356/603; 356/389; 356/400; 702/80; 702/117; 250/559.29; 250/208.1
(58) Field of Classification Search .......... 356/603–615, 356/629, 389, 237.1, 622, 400–445; 702/80–831
See application file for complete search history.

(56) References Cited

U.S. PATENT DOCUMENTS

| | | | |
|---|---|---|---|
| 4,689,491 A | 8/1987 | Lindow et al. | |
| 5,091,963 A | 2/1992 | Litt et al. | |
| 6,433,872 B1 | 8/2002 | Nishi et al. | |
| 6,647,148 B2 | 11/2003 | Ozawa et al. | |
| 6,836,532 B2 | 12/2004 | Durst et al. | |
| 6,861,614 B1 | 3/2005 | Tanabe et al. | |
| 6,933,185 B2 | 8/2005 | Wada et al. | |
| 6,975,386 B2 | 12/2005 | Tsumura et al. | |
| 7,050,878 B2 | 5/2006 | Yamazaki et al. | |
| 7,425,703 B2 | 9/2008 | Nakasuji et al. | |

(Continued)

FOREIGN PATENT DOCUMENTS

JP         2000-31229          1/2000

(Continued)

*Primary Examiner* — Gregory J Toatley
*Assistant Examiner* — Iyabo S Alli
(74) *Attorney, Agent, or Firm* — Husch Blackwell LLP

(57) ABSTRACT

A method for making a sample for evaluation of laser irradiation position and evaluating the sample, and an apparatus which is switchable between a first mode of modification of semiconductor and a second mode of making and evaluating the sample. Specifically, a sample is made by irradiating a semiconductor substrate for evaluation with a pulse laser beam while the semiconductor substrate is moved for evaluation at an evaluation speed higher than a modifying treatment speed, each relative positional information between pulse-irradiated regions in the sample is extracted, and stability of the each relative positional information between pulse-irradiated regions is evaluated. The evaluation speed is such a speed that separates the pulse-irradiated regions on the sample from each other in a moving direction.

24 Claims, 14 Drawing Sheets

U.S. PATENT DOCUMENTS

| | | | |
|---|---|---|---|
| 8,045,184 B2 * | 10/2011 | Kawakami et al. | 356/615 |
| 8,144,341 B2 * | 3/2012 | Kawakami et al. | 702/81 |
| 2003/0142298 A1 | 7/2003 | Ujihara et al. | |
| 2004/0254769 A1 | 12/2004 | Miyairi et al. | |

FOREIGN PATENT DOCUMENTS

| | | |
|---|---|---|
| JP | 2000-114174 | 4/2000 |
| JP | 2001-196430 | 7/2001 |
| JP | 2002-158186 | 5/2002 |

* cited by examiner

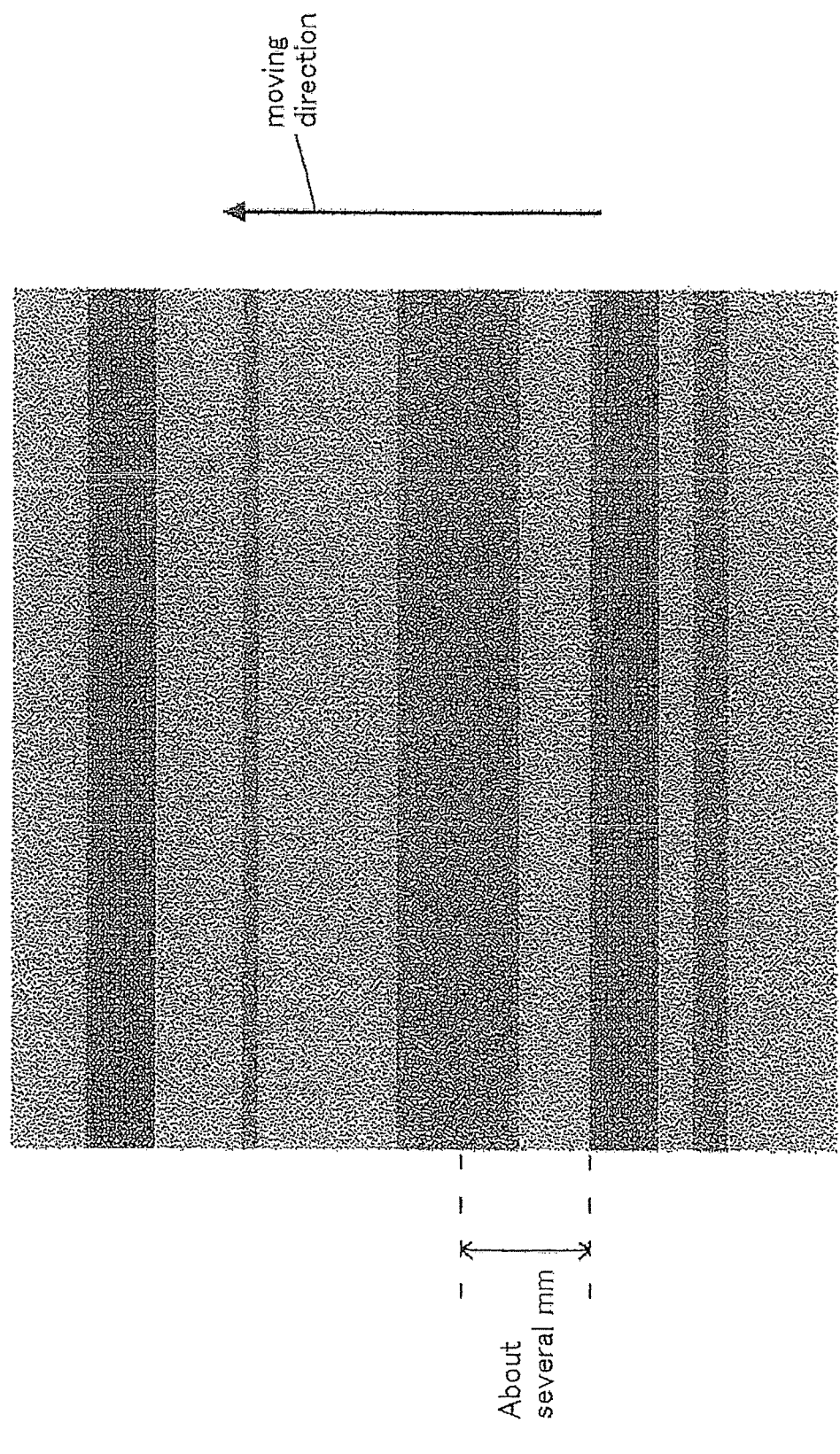

MAKING METHOD OF SAMPLE FOR EVALUATION OF LASER IRRADIATION POSITION AND MAKING APPARATUS THEREOF AND EVALUATION METHOD OF STABILITY OF LASER IRRADIATION POSITION AND EVALUATION APPARATUS THEREOF

This application is a continuation of U.S. application Ser. No. 13/279,559 filed on Oct. 24,2011 now U.S. Pat. No. 8,144,341 which is a continuation of U.S. application Ser. No. 12/361,284 filed on Jan. 28, 2009 (now U.S. Pat. No. 8,045,184 issued Oct. 25, 2011).

BACKGROUND OF THE INVENTION

1. Field of the Invention

The present invention relates to a making method of sample for evaluation of laser irradiation position and a making apparatus thereof In the method and apparatus, while a semiconductor substrate is sequentially irradiated with a pulse laser beam, a portion to be irradiated with the laser beam, of the semiconductor substrate, is moved in a predetermined moving direction at a modifying treatment speed to continuously increase regions irradiated with the pulse laser beam on the semiconductor substrate. In addition, the present invention relates to an evaluation method of stability of laser irradiation position and an evaluation apparatus thereof In the method and apparatus, stability of laser irradiation position is evaluated on the basis of the sample for evaluation of laser irradiation position, which is obtained by the making method of sample for evaluation of laser irradiation position or the making apparatus thereof.

2. Description of the Related Art

Modification of semiconductor with laser irradiation means that an amorphous semiconductor is crystallized with laser irradiation; a size of crystal grains of crystal semiconductor is increased with laser irradiation; defects in crystal grains of crystal semiconductor are reduced with laser irradiation; amorphous portions among crystal grains of crystal semiconductor are crystallized with laser irradiation; or an effect combining the above effects is obtained with laser irradiation. FIG. 12A illustrates a structure of a laser irradiation device 40 which performs modifying treatment of semiconductor. FIG. 12B is a view viewed along arrows B-B in FIG. 12A. In modification of semiconductor, as illustrated in FIGS. 12A and 12B, a portion to be irradiated with a pulse laser beam, of a semiconductor substrate 1 is moved in a predetermined moving direction at the modifying treatment speed while the semiconductor substrate 1 is sequentially irradiated with the pulse laser beam at a predetermined repetition rate by the laser irradiation device 40 so that regions irradiated with the pulse laser beam on the semiconductor substrate 1 are continuously increased. In general, a pulse laser beam is adjusted so that a cross-sectional shape perpendicular to the moving direction of the laser beam is long (for example, rectangular or linear) like a shape represented by dotted lines in FIG. 12B by a laser shape adjusting optical system 41, and the semiconductor substrate 1 is irradiated with the pulse laser beam. Therefore, a shape of a portion to be irradiated with the laser beam is also long. Movement of a region irradiated with the pulse laser beam is, for example, as illustrated in FIGS. 12A and 12B, performed by moving a stage 42 on which the semiconductor substrate 1 is put in the moving direction by a moving device 43 while the semiconductor substrate 1 is irradiated with the pulse laser beam. Accordingly, a desired range of the semiconductor substrate 1 is irradiated with the pulse laser beam. Such a laser irradiation device (laser annealing device) is described in Patent Document 1 (Japanese Published Patent Application No. 2002-158186), for example.

In some cases, a semiconductor substrate which is irradiated with a pulse laser beam by the above-described laser irradiation device has irradiation unevenness. The term "irradiation unevenness" means that the number of irradiation of pulse laser beam is different from region to region on the semiconductor substrate. For example, in FIG. 13, the region with a dark color shows a region irradiated with the pulse laser beam many times, and the region with a light color shows a region irradiated with the pulse laser beam far fewer times than the region with a dark color.

SUMMARY OF THE INVENTION

Conventionally, although it has been possible that an image of a region irradiated with the pulse laser beam on a semiconductor substrate is taken and whether the irradiation unevenness is generated as shown in FIG. 13 is evaluated from the taken image data, it has been difficult to evaluate how much an irradiation position is moved per pulse. Therefore, conventionally, it has been difficult to evaluate stability of pulse irradiation position with high accuracy. Irradiation unevenness as shown in FIG. 13 is generated by longer time than a pulse time of pulse laser beam. However, still, it is desirable that how much the irradiation position is moved per pulse can be evaluated in order to evaluate stability of pulse irradiation position with high accuracy.

Note that irradiation unevenness as shown in FIG. 13 appears on the order of several mm. The time required for transporting a semiconductor substrate (stage) by several mm during modifying treatment of semiconductor is order of several seconds. Therefore, this length of time is longer than the pulse time of pulse laser beam which is emitted at a certain repetition rate, for example, several hundreds Hz. Thus, irradiation unevenness is considered to be generated because the pulse irradiation position is drifted for a long time as described above between the position represented by a dotted line and the position represented by a solid line shown in FIG. 14. The drift of the pulse irradiation position is considered to be generated because the emission angle of pulse laser beam and the emission position of pulse laser beam from a laser resonator are moved. As a result, the above-described irradiation unevenness is generated.

Thus, a first object of the present invention is to provide a making method and a making apparatus for making a sample for evaluation of stability of laser irradiation position in order to evaluate a movement of irradiation position per pulse laser beam. Further, a second object of the present invention is to provide an evaluation method and an evaluation apparatus of stability of laser irradiation position, with which can evaluate stability of pulse irradiation position with high accuracy, by using the sample which, is made by the making method or making apparatus of a sample for evaluation of laser irradiation position.

In order to achieve the first object, according to one of the making methods of a sample for evaluation of laser irradiation position of the present invention, while a semiconductor substrate is irradiated sequentially with a pulse laser beam, a portion to be irradiated with the pulse laser beam (hereinafter, it is also referred to as a pulse irradiation portion), of a semiconductor substrate is moved in a predetermined moving direction at a modifying treatment speed to continuously increase regions irradiated with the pulse laser beam (hereinafter, it is also referred to as pulse-irradiated regions) on the semiconductor substrate in the moving direction for modification of the semiconductor substrate, including moving a pulse irradiation portion of a laser irradiation object (hereinafter, it is also referred to as an "object" simply), which is to be used as a sample for evaluation of laser irradiation position, at a speed for evaluation (hereinafter, it is referred to as an evaluation speed) higher than the modifying treatment speed, while irradiating the object with the pulse laser beam, wherein the evaluation speed is such a speed that can separate the pulse-irradiated regions on the object from each other in the moving direction.

In the making method for a sample for evaluation of laser irradiation position, the pulse irradiation portion of the object is moved in the moving direction at the evaluation speed higher than the modifying treatment speed while the object is irradiated with the pulse laser beam, wherein the evaluation speed is such a speed that can separate the pulse-irradiated regions on the object from each other in the moving direction. Therefore, since the pulse-irradiated regions are separated from each other on the object, each relative positional relationship between the pulse-irradiated regions relating to stability of laser irradiation position is recorded on the object. Thus, the object can correspond to a sample for evaluation of stability of irradiation position with which can evaluate a movement of irradiation position per pulse laser beam.

In order to achieve the second object, according to one of the evaluation methods of stability of laser irradiation position of the present invention, while a semiconductor substrate is irradiated sequentially with a pulse laser beam, a pulse irradiation portion of the semiconductor substrate is moved in a predetermined moving direction at a modifying treatment speed to continuously increase pulse-irradiated regions on the semiconductor substrate in the moving direction for modification of the semiconductor substrate, obtaining image data of an object formed by the making method of a sample for evaluation of laser irradiation position, by an imaging device; extracting each relative positional information between pulse-irradiated regions on the object from the image data; and evaluating stability of laser irradiation position on the basis of the information.

In the evaluation method of stability of laser irradiation position, the region including pulse-irradiated regions on the object is imaged by an imaging device to obtain image data, and each relative positional information between pulse-irradiated regions on the object is extracted from the image data, and then stability of laser irradiation position is evaluated on the basis of the information, so that how much the irradiation position is moved per pulse can be evaluated. Therefore, stability of pulse irradiation position can be evaluated with high accuracy. For example, each relative position data (longitudinal data) between many irradiated regions which are adjacent can be obtained, and accordingly, an evaluation of stability of laser irradiation position for a longer time than the pulse time of pulse laser beam can be performed with high accuracy.

Preferably, on the basis of the information, in a predetermined evaluation range in the moving direction on the object, it is judged whether a condition that each relative positional relationship between adjacent irradiation regions is in a predetermined acceptable range is satisfied for each adjacent irradiated region, and whether a predetermined acceptable number or more number of portions not satisfying the condition continuously exist.

Thus, in a case where the portion which does not satisfy the condition has a predetermined acceptable number of portions not satisfying the condition or more portions not satisfying the condition continuously exist, there is high possibility that a characteristic of the semiconductor substrate which is irradiated with the laser beam is adversely affected. Therefore, in this case, it can be appropriately judged that the stability of laser irradiation position is low.

In order to achieve the first object, according to one of the making apparatuses of a sample for evaluation of laser irradiation position of the present invention, while a semiconductor substrate is irradiated sequentially with a pulse laser beam, a pulse irradiation portion is moved in a predetermined moving direction at a modifying treatment speed to continuously increase pulse-irradiated regions on the semiconductor substrate in the moving direction for modification of the semiconductor substrate, including a moving device by which the pulse irradiation portion of an object is moved at an evaluation speed higher than the modifying treatment speed, while irradiating the object with the pulse laser beam, wherein the evaluation speed is such a speed that can separate pulse-irradiated regions on the object from each other in the moving direction.

With use of the making apparatus of a sample for evaluation of laser irradiation position, a similar effect to the making method of sample for evaluation of laser irradiation position can be obtained.

The moving device is the making apparatus of a sample for evaluation of laser irradiation position, which is switchable between a first operation mode in which the pulse irradiation portion is moved at the modifying treatment speed in modification of semiconductor and a second operation mode in which the pulse irradiation portion is moved at the evaluation speed in making the sample for evaluation of laser irradiation position.

Thus, by employing the structure in which the moving device is switchable between the first operation mode in which the pulse irradiation portion is moved at the modifying treatment speed in modification of semiconductor and the second operation mode in which the pulse irradiation portion is moved at the evaluation speed in making the sample for evaluation of laser irradiation position, a moving device which moves the pulse irradiation portion of the semiconductor substrate in a predetermined moving direction at the modifying treatment speed in modification of semiconductor and a moving device which moves the pulse irradiation portion of the object in a predetermined moving direction at the evaluation speed both can be used in one apparatus.

In order to achieve the second object, according to one of the evaluation apparatuses of stability of laser irradiation position of the present invention, while a semiconductor substrate is irradiated sequentially with a pulse laser beam, a pulse irradiation portion of the semiconductor substrate is moved in a predetermined moving direction at a modifying treatment speed to continuously increase pulse-irradiated regions on the semiconductor substrate in the moving direction for modification of the semiconductor substrate, including: an imaging device by which a region including the pulse-irradiated regions on the object, which has been obtained by the making method of a sample for evaluation of laser irradiation position, is imaged to obtain image data; and a judging device by which each relative positional information between the pulse-irradiated regions on the object is extracted from the image data and stability of laser irradiation position is evaluated on the basis of the information.

According to the evaluation apparatus of stability of laser irradiation position, the similar effect to the evaluation method of stability of laser irradiation position can be obtained.

According to one of the making methods and the making apparatuses of a sample for evaluation of stability of laser irradiation position of the present invention, a sample for evaluation of stability of irradiation position with which can evaluate a movement of irradiation position per pulse laser beam can be made. Further, according to one of the evaluation methods and the evaluation apparatuses of stability of laser irradiation position of the present invention, stability of pulse irradiation position can be evaluated with high accuracy with use of the sample which is made by the making method or making apparatus of a sample for evaluation of laser irradiation position.

BRIEF DESCRIPTION OF THE DRAWINGS

FIG. 13 is an enlarged image of a semiconductor substrate having irradiation unevenness of pulse laser irradiation.

DETAILED DESCRIPTION OF THE INVENTION

A best embodiment mode for carrying out the present invention will be explained with reference to drawings. Note that common references are used for the same portions as those in all drawings, and repeated descriptions are omitted.

[Making Apparatus and Making Method of Sample for Evaluation of Laser Irradiation Position]

Figure 1:
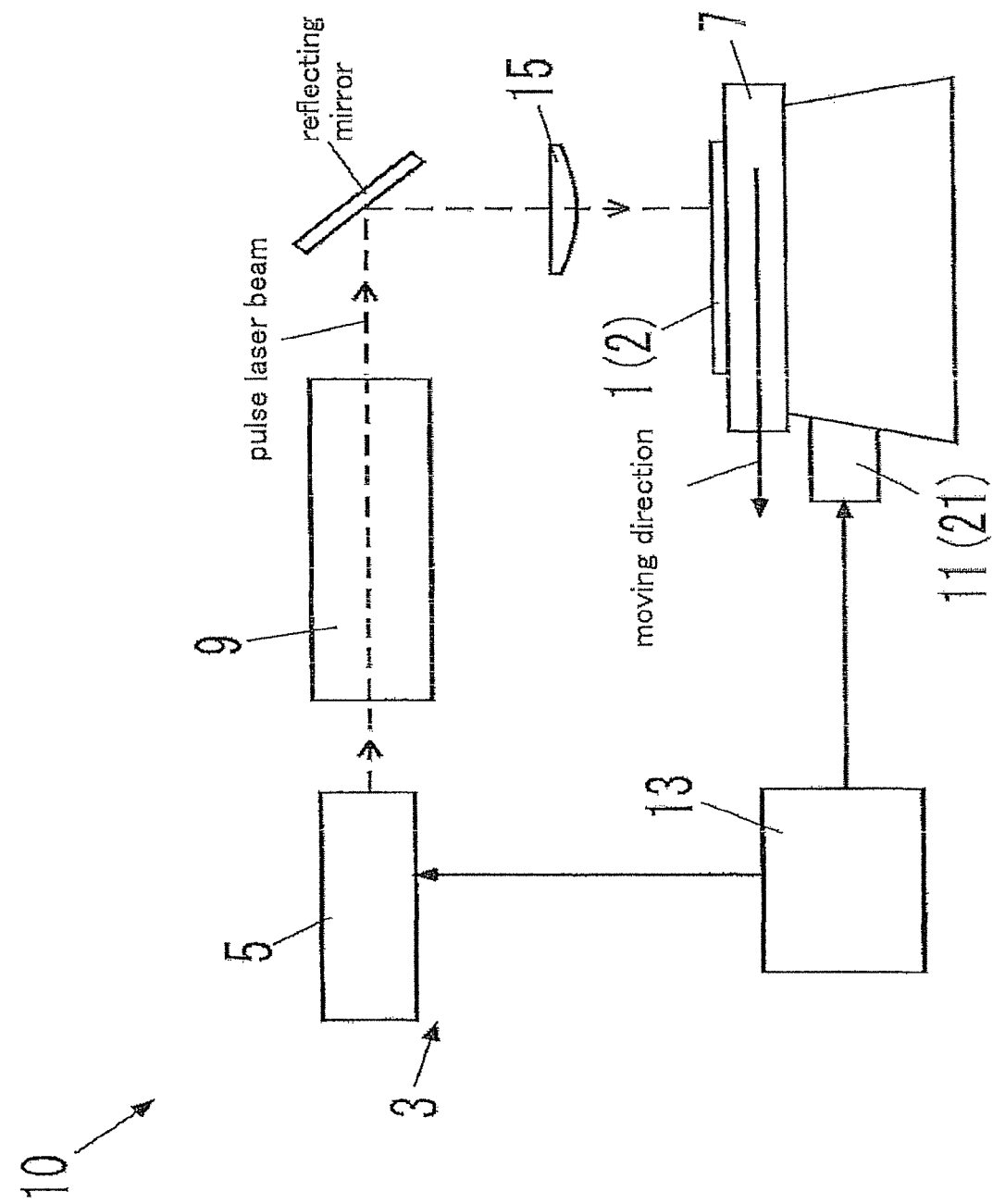
FIG. 1 is a structural view of a making apparatus of a sample for evaluation of laser irradiation position according to Embodiment Mode.

FIG. 1 is a structural view of a making apparatus 10 of sample for evaluation of laser irradiation position according to Embodiment Mode of the present invention. The making apparatus 10 of sample for evaluation of laser irradiation position is a making apparatus of a sample for evaluation of laser irradiation position by a laser irradiation device 3.

In the laser irradiation device 3, while the semiconductor substrate 1 is irradiated sequentially with a pulse laser beam at a constant repetition rate (for example, several tens Hz to several MHz), a pulse irradiation portion of the semiconductor substrate 1 is moved in a predetermined moving direction at a modifying treatment speed to continuously increase pulse-irradiated regions on the semiconductor substrate 1 in the moving direction for modification of the semiconductor substrate 1 with laser irradiation. Accordingly, the semiconductor in the pulse-irradiated regions is modified. Note that the semiconductor substrate 1 may be an insulating substrate over which a semiconductor film is formed, for example.

Figure 12A:
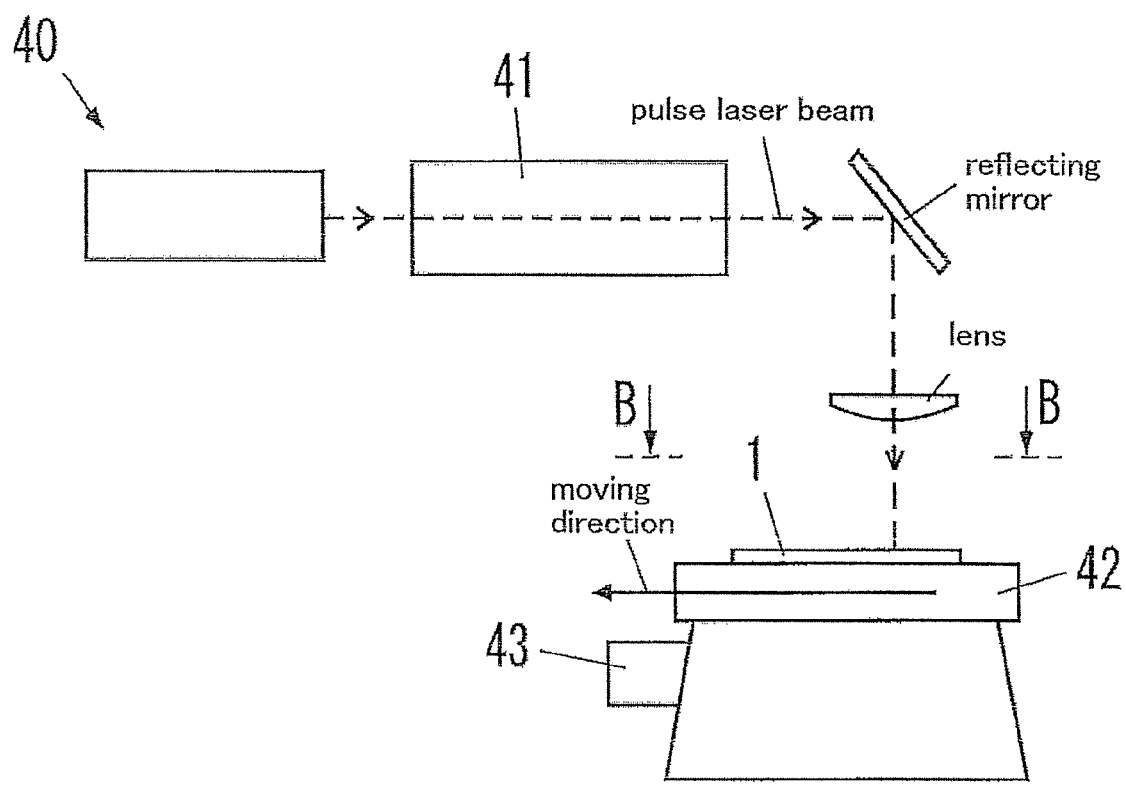
FIG. 12A is a structural view of a conventional laser irradiation device.
Figure 12B:
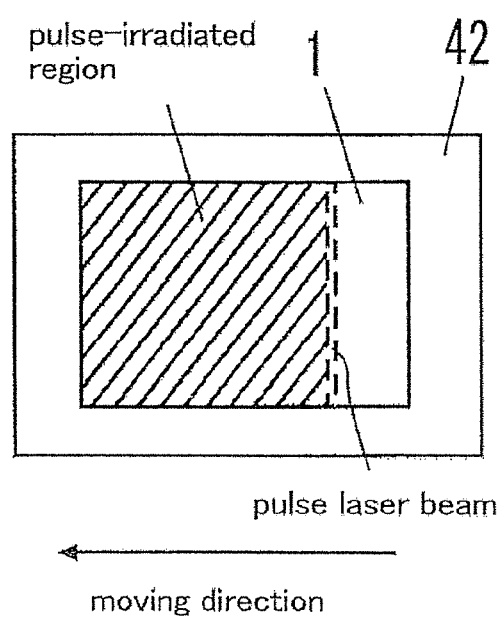
FIG. 12B is a view viewed along arrows B-B in FIG. 12A.

As illustrated in FIG. 1, the laser irradiation device 3 includes a laser light source 5, a stage 7, a laser beam shaping optical system 9, an irradiation position moving device 11, and a control device 13. The laser light source 5 is a laser resonator which emits sequentially a pulse laser beam at a predetermined repetition rate. Note that the laser resonator 5 emits a pulse laser beam at the same repetition rate in modification of semiconductor and in making the sample for evaluation of laser irradiation position. The semiconductor substrate 1, which will be subjected to modifying treatment of semiconductor, is put on the stage 7. The laser beam shaping optical system 9 adjusts a shape of pulse laser beam. A pulse laser beam from the laser resonator 5 passes through the laser beam shaping optical system 9, so that the cross-sectional shape which is perpendicular to a moving direction of pulse laser beam is long (for example, linear or rectangular) in a laser irradiation position of a surface of the semiconductor substrate 1 on the stage 7, as illustrated in FIG. 12B. When the semiconductor substrate 1 is irradiated with the pulse laser beam from the laser resonator 5, the irradiation position moving device 11 moves the stage 7 in a moving direction illustrated in FIG. 1 at a constant modifying treatment speed. The irradiation position moving device 11 may be provided with, for example, a driving motor and a conversion structure (for example, pinion and rack) which converts a rotational movement of the driving motor into a linear movement, and which may make the stage 7 move with a linear movement. With use of the control device 13, the laser resonator 5 and the irradiation position moving device 11 are controlled so that the stage 7 on which the semiconductor substrate 1 is put is moved by the irradiation position moving device 11 while the semiconductor substrate 1 is irradiated with the pulse laser beam. Accordingly, a desired range of a surface of the semiconductor substrate 1 is irradiated with the pulse laser beam, and the substrate is modified through laser annealing treatment in the range. Note that a reference numeral 15 denotes a condensing lens, and the pulse laser beam is converged into the surface of the semiconductor substrate 1 on the stage 7 by using the condensing lens 15.

The making apparatus 10 of sample for evaluation of laser irradiation position is provided with an irradiation position moving device 21, with which a pulse irradiation portion of an object 2 is moved in a moving direction at a constant evaluation speed higher than the modifying treatment speed, when the object 2 is irradiated with the pulse laser beam at a predetermined repetition rate by the laser irradiation device 3. The evaluation speed is such a speed that can separate pulse-irradiated regions on the object 2 in the moving direction from each other. As one example thereof, the evaluation speed is 100 times or several 100 times as high as the modifying treatment speed. Note that, in this embodiment mode, the object 2 is a semiconductor substrate for evaluation, which is used for evaluation of stability of laser irradiation position, and is the same as the semiconductor substrate 1. Preferably, a top surface of the object 2 may be flat. According to this embodiment mode, the irradiation position moving device 21 of the making apparatus 10 of sample for evaluation of laser irradiation position is the same as the irradiation position moving device 11 of the laser irradiation device 3, and also serves as the irradiation position moving device 11 of the laser irradiation device 3.

The irradiation position moving device 21 is switchable between a first operation mode in which a pulse irradiation portion is moved at the modifying treatment speed in modification of semiconductor, and a second operation mode in which a pulse irradiation portion is moved at the evaluation speed in making a sample for evaluation of laser irradiation position. For example, in a case where the irradiation position moving device 21 includes the driving motor and the conversion structure as described above, a conversion device which is switchable between power and current supplied from a power supply source to the driving motor is provided in order to switch between the first operation mode and the second operation mode. This switching may be performed by operation of an operation portion of the conversion device by an operator.

Figure 2:
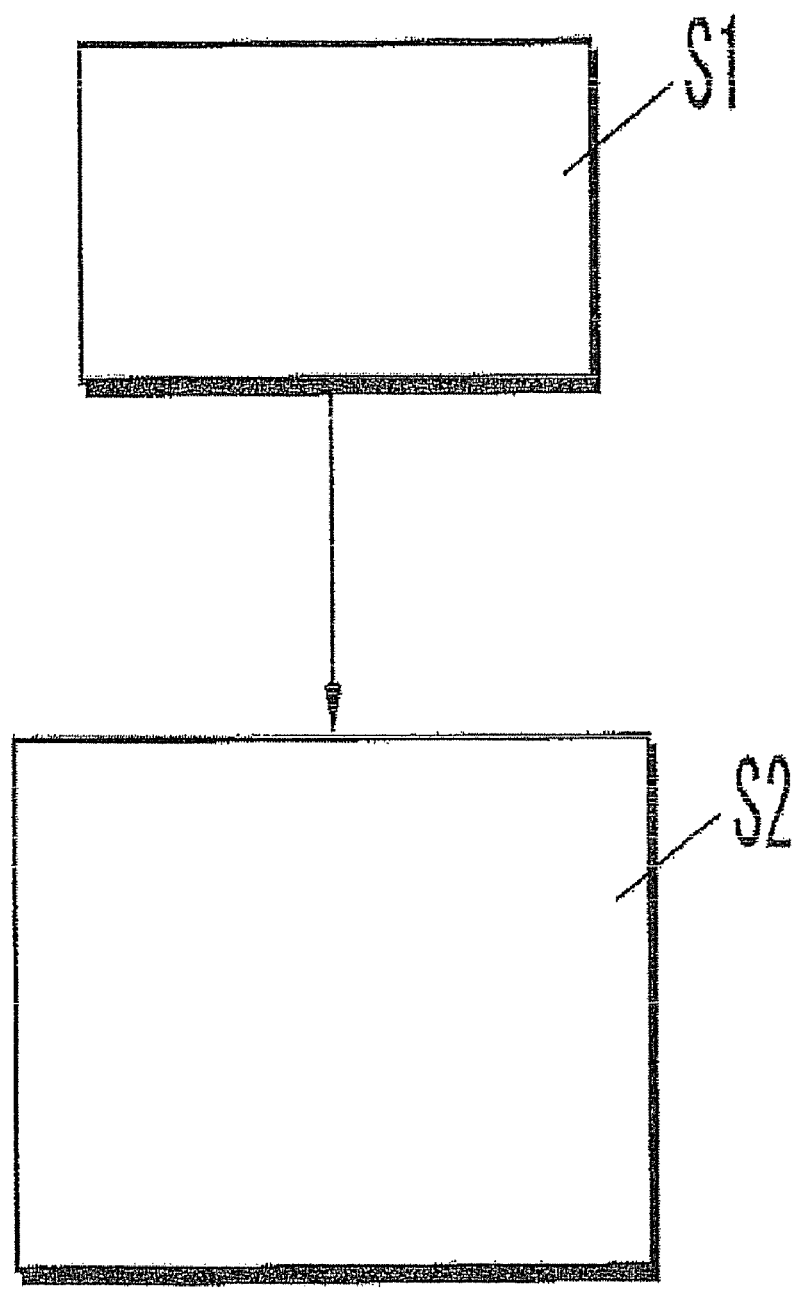
FIG. 2 is a flow chart showing a making method of a sample for evaluation of laser irradiation position according to Embodiment Mode.

Next, a making method of sample for evaluation of laser irradiation position using the making apparatus 10 of sample for evaluation of laser irradiation position is described. FIG. 2 is a flow chart showing a making method of sample for evaluation of laser irradiation position. First, in a step S1, the semiconductor substrate 2 for evaluation which serves as a sample for evaluation of laser irradiation position is put on the stage 7. In a step S2, the stage 7 is moved in the moving direction as shown in FIG. 1 by the irradiation position moving device 21 while the semiconductor substrate 2 for evaluation is irradiated with the pulse laser beam. Accordingly, a pulse irradiation portion of the semiconductor substrate 2 for evaluation is moved in the moving direction at the evaluation speed higher than the modifying treatment speed, while pulse laser irradiation is performed.

Figure 3:
FIG. 3 is an enlarged image of a surface of a semiconductor substrate for evaluation which is irradiated with a laser beam by a making method of a sample for evaluation of laser irradiation position.

In the making method of sample for evaluation of laser irradiation position, the pulse irradiation portion of the semiconductor substrate 2 for evaluation is moved in a moving direction at (a constant) evaluation speed higher than a modifying treatment speed, while the semiconductor substrate 2 for evaluation is irradiated with the pulse laser beam at a certain repetition rate by the laser irradiation device 3, and the evaluation speed is set to such a speed that can separate the pulse-irradiated regions on the semiconductor substrate 2 for evaluation in the moving direction from each other. FIG. 3 shows image data of a top surface of the semiconductor substrate 2 for evaluation which is irradiated with the pulse laser beam by this method, and is taken by using an optical microscope. As shown in FIG. 3, the pulse-irradiated regions are separated from each other in the moving direction. Therefore, thus, the pulse-irradiated regions on the semiconductor substrate 2 for evaluation are separated from each other, and each relative positional relationship between the pulse-irradiated regions relating to stability of laser irradiation position is recorded on the semiconductor substrate 2 for evaluation, so that the semiconductor substrate 2 for evaluation can be used as a sample for evaluation of stability of irradiation position with which a movement of the irradiation position per pulse laser can be evaluated.

By employing a structure in which the irradiation position moving device 21 is switchable between the first operation mode in which a pulse irradiation portion is moved at the modifying treatment speed in modification of semiconductor and the second operation mode in which a pulse irradiation portion is moved at the evaluation speed in making a sample for evaluation of laser irradiation position, the irradiation position moving device 11 which moves the pulse irradiation portion of the semiconductor substrate 1 in a predetermined moving direction at the modifying treatment speed in modification of semiconductor, and the irradiation position moving device 21 which moves the pulse irradiation portion of the semiconductor substrate 2 for evaluation in a predetermined moving direction at a constant evaluation speed higher than a modifying treatment speed can both be used in one apparatus.

[Making Apparatus and Making Method of Sample for Evaluation of Laser Irradiation Position]

Figure 4:
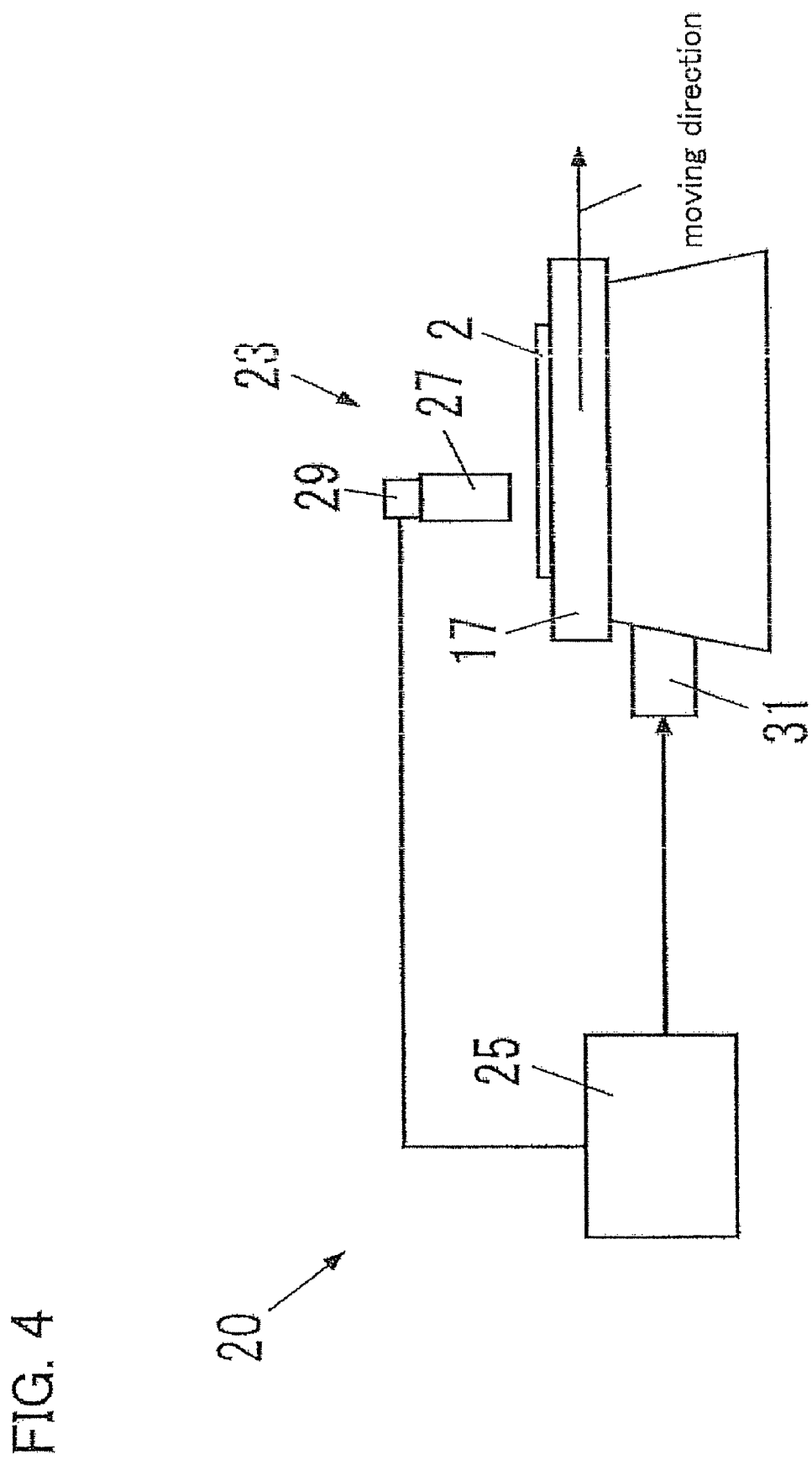
FIG. 4 is a structural view of an evaluation apparatus of stability of laser irradiation position according to Embodiment Mode.

FIG. 4 is a structural view of an evaluation apparatus 20 of stability of laser irradiation position according to Embodiment Mode of the present invention. The evaluation apparatus 20 of stability of laser irradiation position is an apparatus for evaluating stability of laser irradiation position by the laser irradiation device 3, and includes an imaging device 23 and a judging device 25.

The imaging device 23 is used to obtain image data by taking an image of a region including the pulse-irradiated regions on the semiconductor substrate 2 for evaluation which is irradiated with the pulse laser beam by the above-described making method of sample for evaluation of laser irradiation position. In the example of FIG. 4, the imaging device 23 includes a microscope 27 with a magnification power of e.g., 200, a CCD camera 29 for taking an image of the semiconductor substrate 2 for evaluation through the microscope 27, and a light source (not shown) such as a halogen lamp for securing brightness for taking the image. Further, the imaging device 23 includes a stage 17 on which the semiconductor substrate 2 for evaluation is put and a moving device 31 which moves the stage 17. The stage 17 is a stage on which the semiconductor substrate 2 for evaluation is put. The moving device 31, for example, includes a driving motor and a conversion structure which converts a rotational movement of the driving motor into a linear movement, and moves the stage 17 in a direction where the above-described pulse-irradiated region is separated by the conversion structure. Note that the stage 17 and the moving device 31 are the same as the stage 7 and the irradiation position moving device 11, respectively, which are provided in the laser irradiation device 3 in FIG. 1, and the stage 17 and the moving device 31 may also serve as the stage 7 and the irradiation position moving device 11, respectively, which are provided in the laser irradiation device 3.

The judging device 25 extracts each relative positional information between the pulse-irradiated regions on the semiconductor substrate 2 for evaluation from the image data taken by the imaging device 23, and evaluates stability of laser irradiation position by the laser irradiation device 3 on the basis of the information. The judging device 25 may be a computer.

Figure 5:
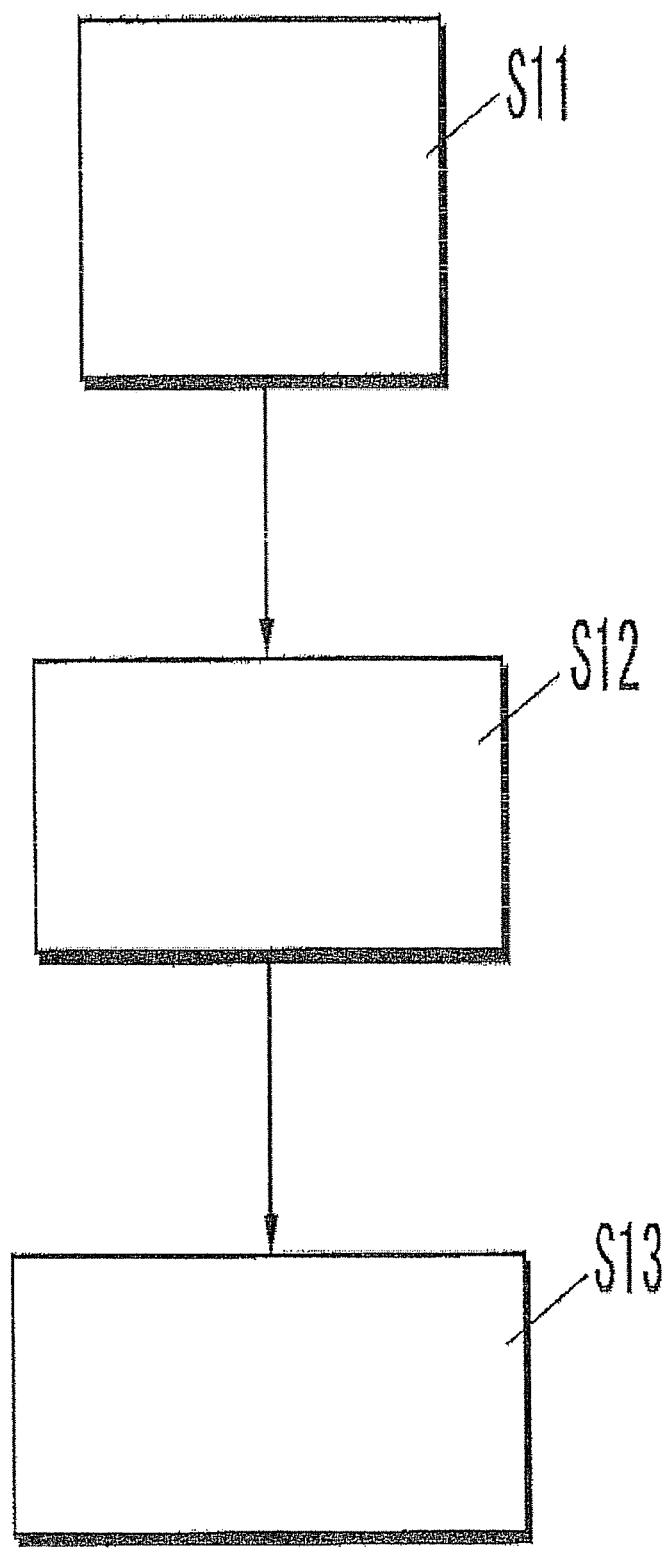
FIG. 5 is a flow chart showing an evaluation method of stability of laser irradiation position according to Embodiment Mode.

Next, an evaluation method of stability of laser irradiation position using the above-described evaluation apparatus 20 of stability of laser irradiation position is described. FIG. 5 is a flow chart showing an evaluation method of stability of laser irradiation position.

In a step S11, the semiconductor substrate 2 for evaluation which is irradiated with the pulse laser beam by the above-described making method of a sample for evaluation of laser irradiation position is put on the stage 17. Note that, in a case where the stage 17 is the stage 7 in FIG. 1, the semiconductor substrate 2 for evaluation which is irradiated with the pulse laser beam by the above-described making method of sample for evaluation of laser irradiation position may be still put on the stage 7.

In a step S12, the stage 17 is moved in the moving direction illustrated in FIG. 4 by the moving device 31 while the image of the semiconductor substrate 2 for evaluation is taken by the CCD camera 29. For example, the semiconductor substrate 2 for evaluation is moved in stages in a moving direction at a predetermined pitch using the driving motor of the moving device 31 as a stepping motor, and the image of the semiconductor substrate 2 for evaluation is taken by the CCD camera 29 every time the semiconductor substrate 2 for evaluation is moved. Accordingly, image data which covers a predetermined evaluation range of the moving direction is obtained. Note that this moving direction is parallel to a direction where the above-described pulse-irradiated regions are separated from each other.

In a step S13, the judging device 25 extracts each relative positional information between pulse-irradiated regions on the semiconductor substrate 2 for evaluation from the image data, and evaluates stability of laser irradiation position by the laser irradiation device 3 on the basis of the information. At this time, the judging device 25 judges whether a condition that each relative positional relationship between the adjacent irradiated regions is in the acceptable range is satisfied and whether the portion which does not satisfy the condition has a predetermined acceptable number of portions not satisfying the condition or more portions not satisfying the condition continuously exist. In a case where the judging device 25 judges that there are the portions which do not satisfy the condition have a predetermined acceptable number of portions not satisfying the condition or more portions not satisfying the condition continuously exist, the judging device 25 outputs a signal that stability of laser irradiation position by the laser irradiation device 3 is low. For example, that signal is displayed in a display device (not shown) of the judging device 25. On the other hand, in a case where the judging device 25 judges that the portion does not has a predetermined acceptable number of portions not satisfying the condition or more portions not satisfying the condition continuously exist, the judging device 25 outputs a signal that the laser irradiation device 3 has sufficiently high stability of laser irradiation position. For example, that signal is displayed in the display device.

Process of the step S13 are described in detail. The judging device 25 calculates data which is used for imaging control or for evaluating stability of laser irradiation position on the basis of setting data and extraction data.

The setting data is held and stored in a memory portion of the judging device 25. The whole or a part of the setting data may be input to the judging device 25 through an interface of the judging device 25 and stored in the memory portion. Further, the whole or a part of the setting data may be set and stored in the memory portion by operation of an operation portion of the judging device 25 by an operator. As the setting data, the following data which is set depending on a condition of the laser irradiation to the semiconductor substrate 1 is given.

Pulse laser size r (μm) . . . Size of the moving direction of pulse laser beam on a laser irradiation portion on a surface of the semiconductor substrate 1.

Modifying treatment speed v (mm/sec) . . . Speed for transporting and moving the semiconductor substrate 1 (stage 17) in the moving direction in modification of semiconductor by the laser irradiation device 3.

Energy density ED (mJ/cm$^2$) . . . Energy density of a pulse laser beam.

Repetition rate of a pulse laser beam h (Hz) . . . The number of a pulse laser beam emitted from the laser irradiation device 3 per second.

Evaluation speed vp (mm/sec) . . . Speed at which the irradiation position moving device 21 transports and moves the semiconductor substrate 2 (stage 17) for evaluation in making a sample for evaluation of laser irradiation position.

Length for judgment Ld(mm) . . . Length for the moving direction in the semiconductor substrate 2 for evaluation. This length corresponds to a range for judgment.

Length for error judgment Le (mm) . . . Length for the moving direction in the semiconductor substrate 2 for evaluation. In a case where a movement of the laser irradiation positions sequentially exceeds an acceptable value in the length, stability of the laser irradiation position is judged to be low.

Acceptable diameter of crystal grain Δgs (μm) . . . Acceptable minimum value of diameter and size of the crystal grain. That is, the diameter of crystal grain which is smaller than the acceptable minimum value exceeds an acceptable range. Δgs corresponds to a value of vertical axis in FIG. 6.

$a_{ED}$ . . . A coefficient which is determined depending on the energy density ED. $a_{ED}$ corresponds to a slope of a linear function shown in FIG. 6.

$b_{ED}$ (nm) . . . A value which is determined depending on the energy density ED. $b_{ED}$ corresponds to an intercept of the linear function shown in FIG. 6.

Note that the symbols of the setting data are also used in other portions in this specification. Definitions of the symbols are described as above. Symbols described later are also used in the same manner.

Figure 6:
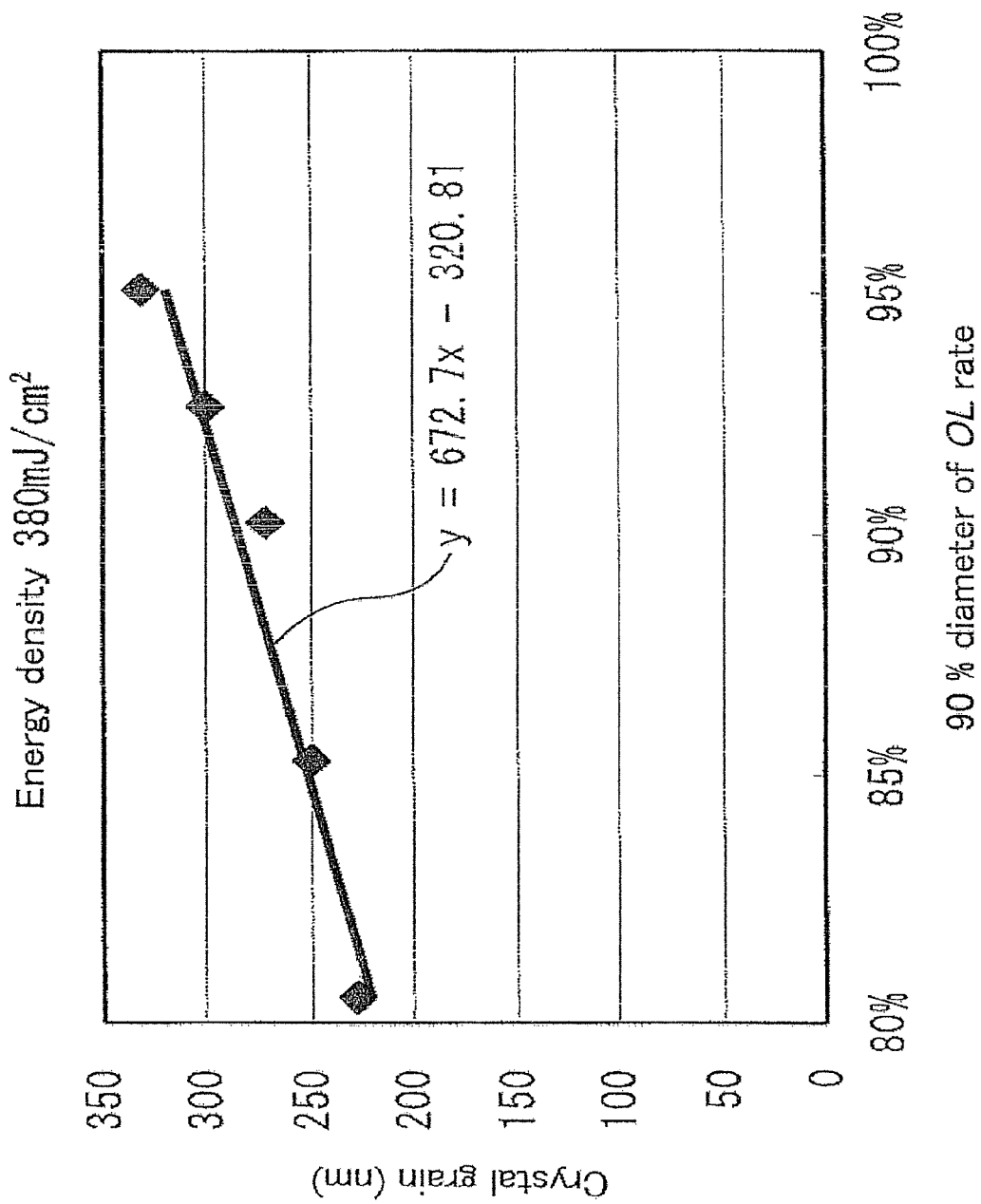
FIG. 6 is a graph showing a relationship between an overlap rate of pulse laser beam and a diameter of crystal grain.
Figure 7:
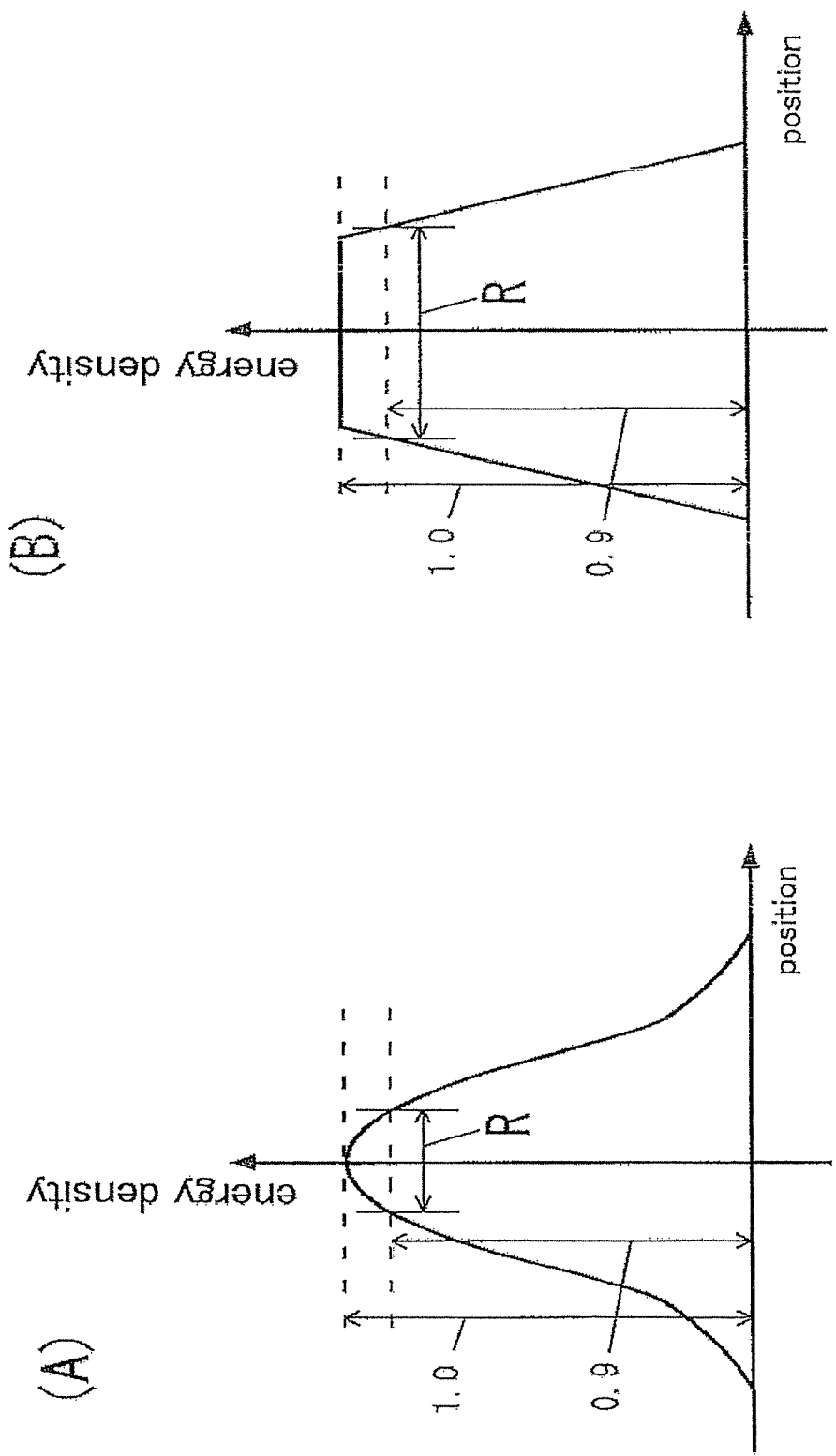
FIGS. 7A and 7B are graphs each showing an energy density of pulse laser beam.
Figure 8:
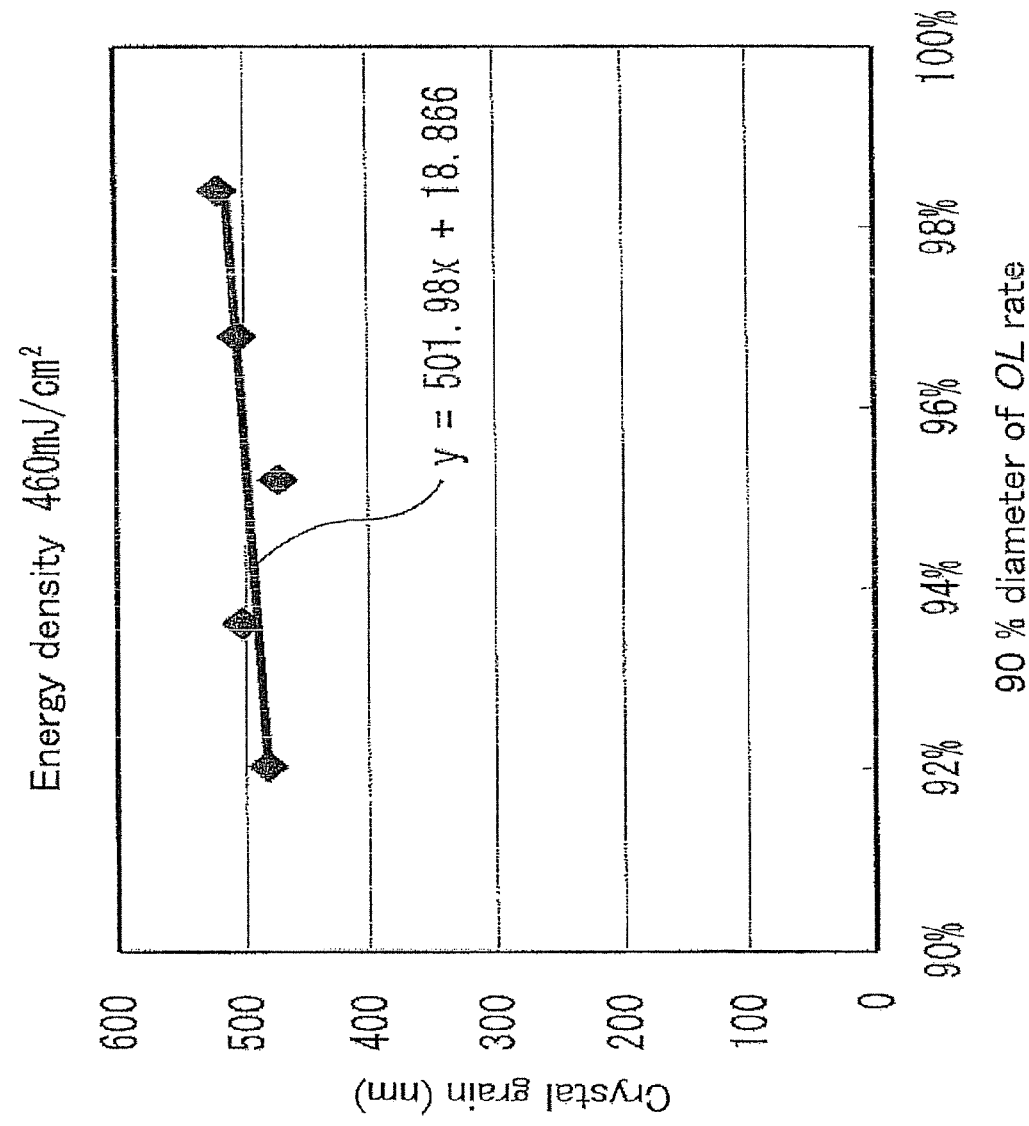
FIG. 8 is another graph showing a relationship between an overlap rate of pulse laser beam and a diameter of crystal grain.

$a_{ED}$ and $b_{ED}$ are determined depending on the energy density ED. For example, when the energy density ED of the pulse laser is 380 (mJ/cm$^2$), a characteristic shown in FIG. 6 can be obtained. In FIG. 6, the horizontal axis x represents the overlap rate of the pulse laser. This overlap rate is obtained by OL=(r−1000 v/h)/r which is described later. That is, the overlap rate is, in a case where the semiconductor substrate 1 is irradiated with a pulse laser beam at a repetition rate of h (Hz) while the semiconductor substrate 1 is moved in the moving direction at the modifying treatment speed v by the laser irradiation device 3 as described above, the proportion of overlapping region of continuous two pulse-irradiated regions to the pulse-irradiated regions. The vertical axis y in FIG. 6 represents a diameter of crystal grain of the semiconductor substrate 1 obtained by modifying treatment of semiconductor by the laser irradiation device 3. Plots represented by a rhombus shape in FIG. 6 are predicted values, and the overlap rate x and the diameter y of semiconductor crystal grain can approximate a linear function y=$a_{ED}$x+$b_{ED}$. In an example in FIG. 6, $a_{ED}$ is 672.2 and $b_{ED}$ is −320.81. Note that, as for the horizontal axis x, "90% diameter" in "90% diameter of OL rate" means that regions where the energy density is greater than or equal to 90% of maximum value thereof are only used as the pulse-irradiated regions, and the other regions are not regarded as the pulse-irradiated regions. For example, FIGS. 7A and 7B each represent an energy density function of a pulse laser beam in the surface of the semiconductor substrate 1, and only a region R is used as the pulse-irradiated region. FIG. 8 represents a case where the energy density ED of a pulse laser beam is 460 (mJ/cm$^2$).

Figure 9:
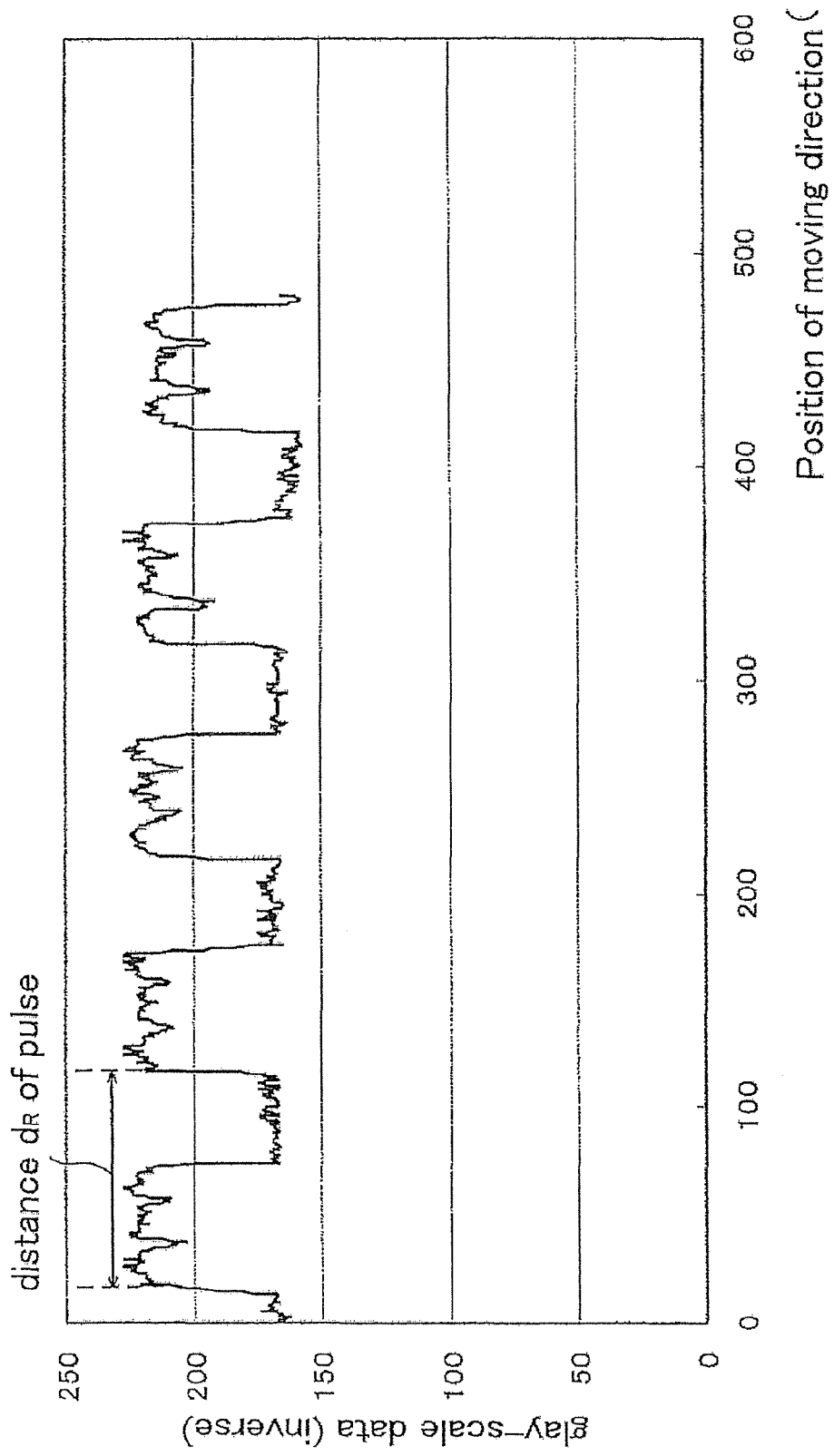
FIG. 9 is a graph showing a gray-scale data of a surface of a semiconductor substrate for evaluation.

As the extraction data, a distance $d_R$ of pulse laser beam is extracted and measured for each adjacent irradiation region from the images obtained by imaging control which is described later. The distance $d_R$ of pulse laser beam is a length shown in FIG. 3, and may be obtained on the basis of the image data by the judging device 25. For example, the distances $d_R$ of each irradiated laser beam shown in FIG. 9 may be automatically obtained from the gray-scale data as follows: analysis processing is performed on the image data by the judging device 25; and the gray-scale data of the moving direction shown in FIG. 9 is extracted. Since the gray-scale values in FIG. 9 are values inverted from the image in FIG. 3, the large range of the gray-scale value in FIG. 9 corresponds to the region with a light color in FIG. 3, and the small range of the gray-scale value in FIG. 9 corresponds to the region with a dark color in FIG. 3. Note that the image data in FIG. 3 or the gray-scale data in FIG. 9 may be displayed in the display device by the judging device 25, and the distance $d_R$ of pulse laser beam may be measured by an operator on the basis of the displayed data, and the distances $d_R$ of pulse laser beam may be input to the judging device 25. The values of distance $d_R$ of each pulse laser beam may be stored in the memory portion of the judging device 25.

The judging device 25 calculates the following data on left side which is used for the evaluation using the following calculation formulas on right side by the setting data and the extraction data.

Overlap Rate OL: $OL=(r-1000\ v/h)/r$

Acceptable overlap rate $\Delta OL$: $\Delta OL=(\Delta gs-b_{ED})/a_{ED}$

Acceptable movement of beam position $\Delta bp$ (μm): $\Delta bp=r \times \Delta OL$ Reference distance of pulse beam dp (μm): $dp=1000\ vp/h$ Movement of beam position $\Delta d$ (μm): $\Delta d=d_R-dp$ The number of judged pulses Pd: $Pd=(Ld/v) \times h$ The number of pulses judged as an error Pe: $Pe=(Le/v) \times h$ Note that each relative positional relationship between the adjacent pulse-irradiated regions is shown by $d_R$ or $\Delta bp$. In this embodiment mode, if $|\Delta d|$ is larger than $\Delta bp/2$, the relative positional relationship is defined to be not in a predetermined acceptable range.

Figure 10:
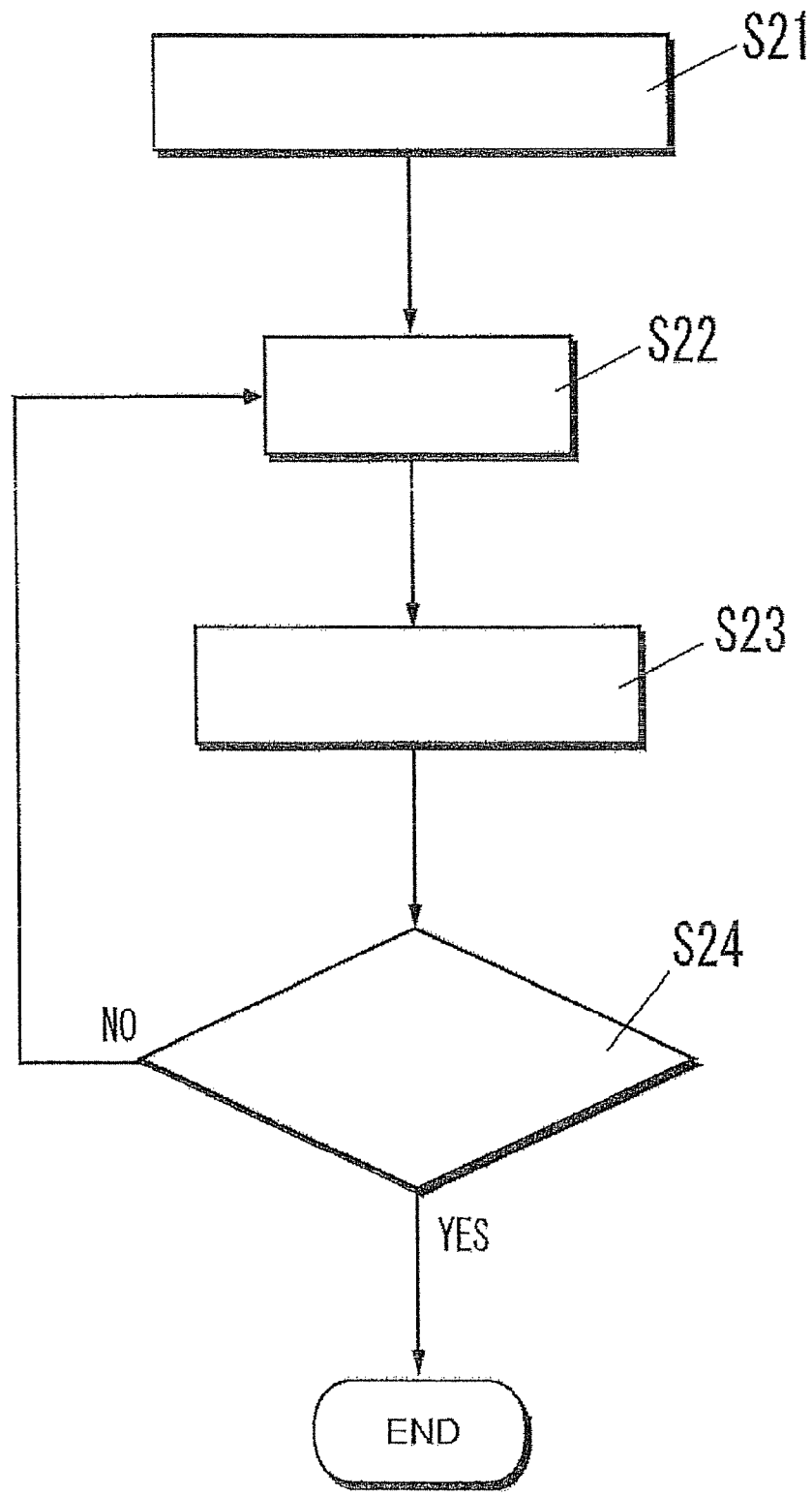
FIG. 10 is a flow chart showing an imaging control according to Embodiment Mode.

The above-described Pd is used for imaging control which is conducted by the judging device 25. FIG. 10 shows a flow chart of the imaging control. In a step S21, the judging device 25 calculates the number of images Pd/n which should be obtained from a number n of pulse-irradiated regions in one image which is taken by the CCD camera 29. In a step S22, the judging device 25 controls the moving device 31 so that the moving device 31 can move the stage 17 in the moving direction at a predetermined pitch. In a step S23, the judging device 25 controls the CCD camera 29 so that the CCD camera 29 can take images of the semiconductor substrate 2 for evaluation in a state where the stage 17 is still left. In a step S24, the judging device 25 judges whether the number of obtained images reaches Pd/n. If the judging device 25 judges that the number reaches that, the imaging control is finished. On the other hand, the judging device 25 judges that the number does not reach that, the process returns to the step S22. By this imaging control, the image data including the pulse-irradiated region of the number of judged pulses Pd is obtained.

Figure 11:
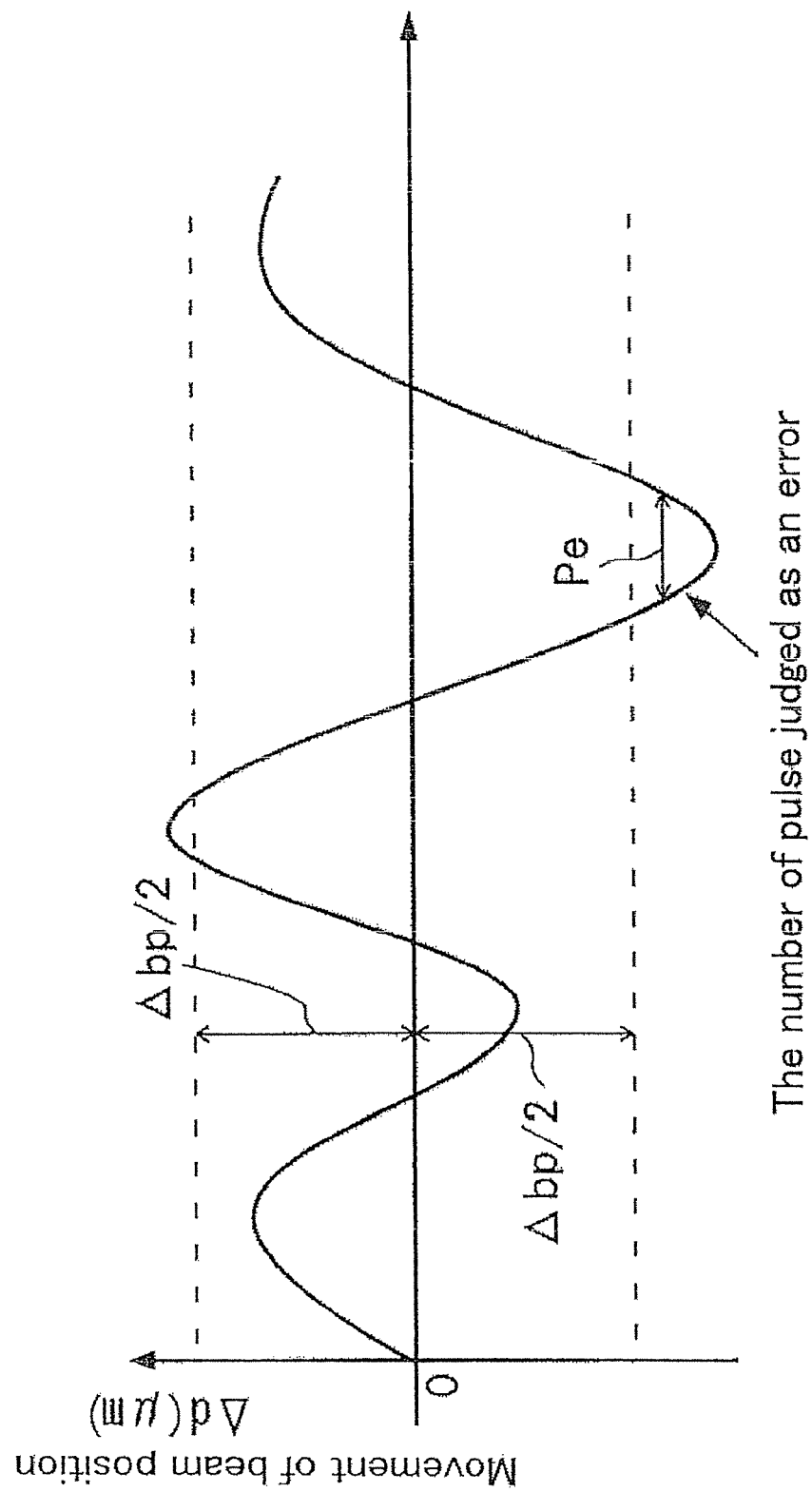
FIG. 11 is a graph showing an evaluation method of stability of laser irradiation position.

The above-described $\Delta bp$ (μm), $\Delta d$ (μm), and Pe are used for evaluation of stability of laser irradiation position which is conducted by the judging device 25. In the image data (evaluation range) obtained by the above-described imaging control, it is judged whether a condition, which $|\Delta d|$ of the irradiation regions does not exceed $\Delta bp/2$ for each adjacent pulse-irradiated region, is satisfied and whether Pe portions not satisfying the condition or more portions not satisfying the condition continuously exist. In a case where the region exists, it is judged that stability of pulse irradiation position is low. On the other hand, in a case where the region does not exist, it is judged that the stability of pulse irradiation position is sufficiently high. FIG. 11 is a graph showing this judgment.

The horizontal axis in FIG. 11 represents a pulse laser number. The pulse laser number is the number which is given in the order in which it is emitted from the laser irradiation device 3. The vertical axis in FIG. 11 represents $\Delta d$ of adjacent pulse laser numbers. In FIG. 11, in an error portion in FIG. 11, $|\Delta d|$ exceeds $\Delta bp/2$ sequentially greater than or equal to Pe. Therefore, in the case of FIG. 11, it is judged by the judging device 25 that the stability of laser irradiation position is low, and the signal indicating the stability is low is output.

By the above-described evaluation apparatus 20 and the evaluation method of stability of laser irradiation position according to Embodiment Mode of the present invention, it can be evaluated that how much the irradiation position is moved per pulse because the image of the region including the pulse-irradiated regions on the semiconductor substrate 2 for evaluation is taken by the imaging device 23 to obtain the image data, and each relative positional information $d_R$ or $\Delta d$ between the pulse-irradiated regions on the semiconductor substrate 2 for evaluation is extracted from the image data, and then the stability of laser irradiation position by the laser irradiation device 3 is evaluated on the basis of the information $d_R$ and $\Delta d$. Therefore, the stability of pulse irradiation position can be evaluated with high accuracy. For example, each relative positional data (longitudinal data) $d_R$ and $\Delta d$ between a large number of adjacent pulse irradiation positions can be obtained, and accordingly, the evaluation of stability of laser irradiation position which is performed longer time than the pulse time of pulse laser beam can be performed with high accuracy.

Further, on the basis of the information, in a predetermined evaluation range on the moving direction in the semiconductor substrate 2 for evaluation, it is judged that the condition which the each relative positional relationship between the adjacent irradiation regions is in the acceptable range is satisfied, and it is judged that whether the portion which does not satisfy the condition has a predetermined acceptable number of portions not satisfying the condition or more portions not satisfying the condition continuously exist. Thus, in a case where the portion which does not satisfy the condition has a predetermined acceptable number of portions not satisfying the condition or more portions not satisfying the condition continuously exist, it is more likely that the characteristic of the semiconductor substrate 1 which is irradiated with the laser beam is adversely affected. Therefore, in this case, it is judged that the stability of the laser irradiation position is low, and the error signal indicating the stability is low is output, so that an appropriate evaluation can be conducted.

The present invention is not limited to the above-described embodiment mode, and it is of course possible to add various changes without departing from the spirit of the present invention.

For example, in the above-described embodiment mode, the irradiation position moving device 21 is used as a device for moving the stage 7, but the irradiation position moving device 21 may move devices for optical systems or optical components. That is, the irradiation position moving device 21 may move together all or a part of a plurality of optical components such as the laser beam shaping optical system 9 or the condensing lens 15. For example, the irradiation position moving device 21 may move the condensing lens 15 together with a reflecting mirror in FIG. 1 in a direction opposite to the moving direction.

Further, in the above-described embodiment mode, the object 2 serves as a semiconductor substrate, but the present invention is not limited thereto. That is, the object 2 may be any object in which pulse-irradiated regions can be observed.

Figure 14:
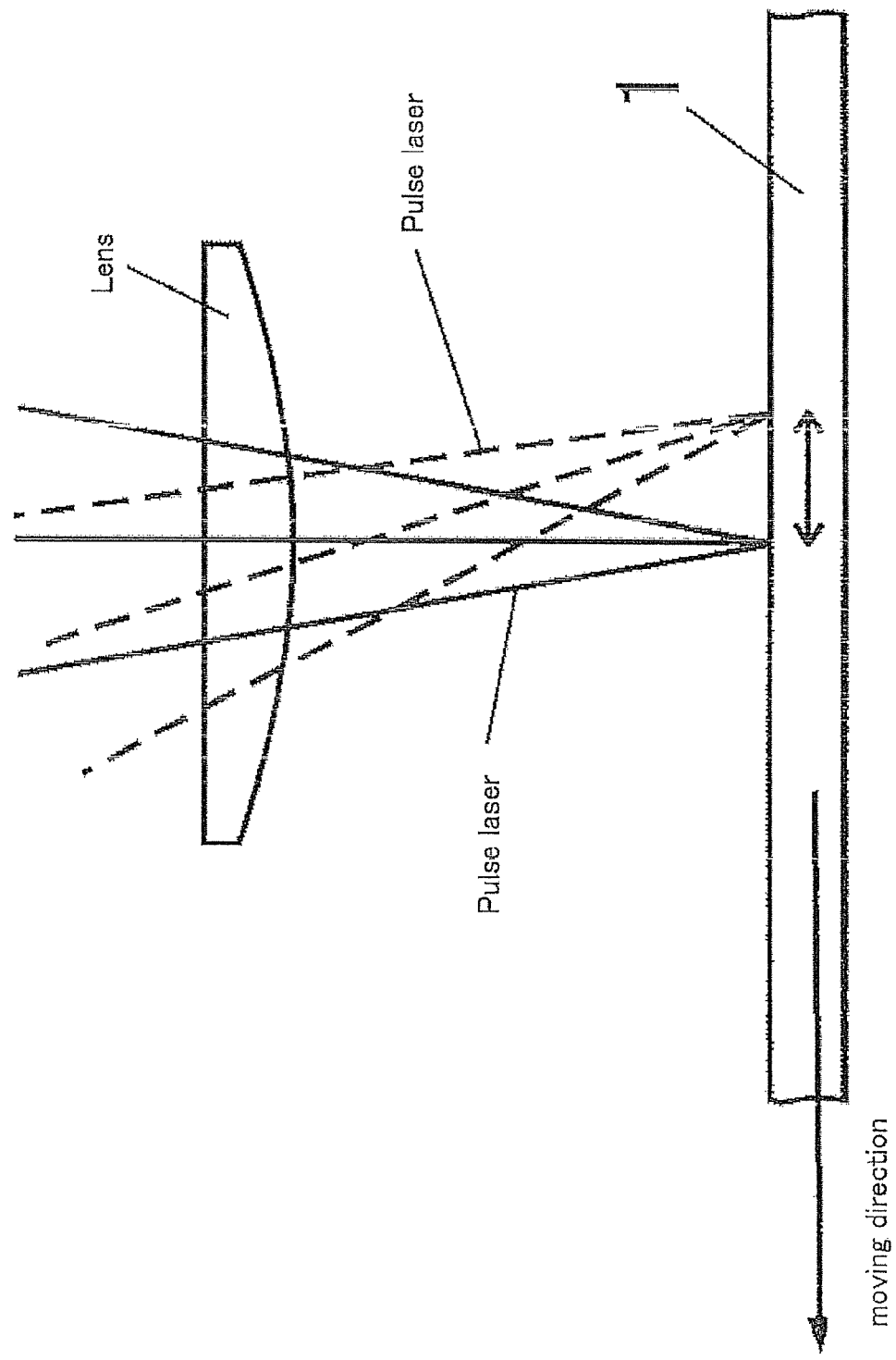
FIG. 14 is a diagram illustrating a drift of laser irradiation position.

Further, according to the present invention, it is possible to evaluate not only the movement of irradiation position due to the movement of the position of pulse laser beam itself as illustrated in FIG. 14, but also the movement of irradiation position due to the movement of the modifying treatment speed, by the moving device, which should be constant.

This application is based on Japanese Patent Application Serial No. 2008-027735 filed with Japan Patent Office on Feb. 7, 2008, the entire contents of which are hereby incorporated by reference.

What is claimed is:

1. A method comprising the step of:
moving a layer comprising an insulating surface and a semiconductor layer on the insulating surface in a predetermined direction at an evaluation speed while the semiconductor layer is irradiated with a plurality of pulse laser beams, thereby forming a sample for evaluation, wherein:
the sample contains pulse-irradiated regions; and
each of the pulse-irradiated regions is formed by a single pulse laser beam that corresponds to one of the plurality of the pulse laser beams.

2. The method according to claim 1, further comprising the steps of:
taking image data of the sample;
extracting each relative positional information between the pulse-irradiated regions in the sample from the image data; and
evaluating stability of the each relative positional information between the pulse-irradiated regions in the sample, wherein:
the each relative positional information contains a distance between adjacent pulse-irradiated regions; and
the evaluation speed is such a speed that separates the pulse-irradiated regions in the sample from each other in the predetermined direction.

3. The method according to claim 1, wherein the pulse-irradiated regions mean regions that obtain an energy density greater than or equal to 90% of a maximum energy density of the pulse laser beams.

4. The method according to claim 1, wherein the predetermined direction is in parallel with a direction where the pulse-irradiated regions in the sample are separated from each other.

5. The method according to claim 2, wherein the taking image data of the sample is performed while moving the sample at a predetermined pitch.

6. A method comprising the steps of:
moving a layer comprising an insulating surface and a semiconductor layer on the insulating surface in a predetermined direction at an evaluation speed while the semiconductor layer is irradiated with a plurality of pulse laser beams, thereby forming a sample for evaluation,
judging whether a condition that each positional relationship between adjacent irradiation regions is in a predetermined acceptable range is satisfied for each adjacent irradiated region; and
judging whether a predetermined acceptable number or more number of portions not satisfying the condition continuously exist in the sample,
wherein:
the sample contains pulse-irradiated regions; and
each of the pulse-irradiated regions is formed by a single pulse laser beam that corresponds to one of the plurality of the pulse laser beams.

7. The method according to claim 6, further comprising the steps of:
taking image data of the sample;
extracting each relative positional information between pulse-irradiated regions in the sample from the image data;
evaluating stability of the each relative positional information between the pulse-irradiated regions in the sample; wherein:
the each relative positional information contains a distance between adjacent pulse-irradiated regions; and
the evaluation speed is such a speed that separates the pulse-irradiated regions in the sample from each other in the predetermined direction.

8. The method according to claim 6, wherein the pulse-irradiated regions mean regions that obtain an energy density greater than or equal to 90% of a maximum energy density of the pulse laser beams.

9. The method according to claim 6, wherein the predetermined direction is in parallel with a direction where the pulse-irradiated regions in the sample are separated from each other.

10. The method according to claim 7, wherein the taking image data of the sample is performed while moving the sample at a predetermined pitch.

11. An apparatus comprising:
a laser light source configured to emit a pulse laser beam at the same repetition rate;
a stage configured to put a layer or a sample on, wherein the layer comprises an insulating surface and a semiconductor layer on the insulating surface; and
a moving device configured to make the stage move;
wherein:
the moving device is switchable between a first operation mode in which the stage is moved at a modifying treatment speed in modification of semiconductor and a second operation mode in which the stage is moved at an evaluation speed in making the sample for evaluation of laser irradiation position; and
the evaluation speed is such a speed to form each of the pulse-irradiated regions in the sample by a single pulse of the pulse laser beam when irradiating the layer with the pulse laser beam while moving the stage with the moving device.

12. The apparatus according to claim 11 further comprising:
an imaging device configured to take image data; and
a judging device configured to evaluate each relative positional information between pulse-irradiated regions in the sample from the image data.

13. A semiconductor modifying treatment apparatus comprising the apparatus according to claim 11.

14. The apparatus according to claim 11, further comprising a conversion device configured to switch the first operation mode in which a pulse irradiation portion is moved at the modifying treatment speed in modification of semiconductor and the second operation mode in which the pulse irradiation portion is moved at the evaluation speed in making the sample for evaluation of laser irradiation position.

15. An apparatus comprising:
a laser light source configured to emit a pulse laser beam at the same repetition rate;
a stage configured to put a layer or a sample on, wherein the layer comprises an insulating surface and a semiconductor layer on the insulating surface;
a moving device configured to make the stage move; and
a control device configured to control the laser light source and the moving device so that the layer on the stage is irradiated with the pulse laser beam;

wherein:
the moving device is switchable between a first operation mode in which the stage is moved at a modifying treatment speed in modification of semiconductor and a second operation mode in which the stage is moved at an evaluation speed in making the sample for evaluation of laser irradiation position; and
the evaluation speed is such a speed to form each of the pulse-irradiated regions in the sample by a single pulse of the pulse laser beam when irradiating the layer or the sample with the pulse laser beam while moving the stage with the moving device.

16. The apparatus according to claim 15 further comprising:
an imaging device configured to take image data; and
a judging device configured to evaluate each relative positional information between pulse-irradiated regions in the sample from the image data.

17. A semiconductor modifying treatment apparatus comprising the apparatus according to claim 15.

18. The apparatus according to claim 15, further comprising a conversion device configured to switch the first operation mode in which a pulse irradiation portion is moved at the modifying treatment speed in modification of semiconductor and the second operation mode in which the pulse irradiation portion is moved at the evaluation speed in making the sample for evaluation of laser irradiation position.

19. A method comprising the step of:
moving a layer comprising an insulating surface and a semiconductor layer on the insulating surface in a predetermined direction at a speed while the semiconductor layer is irradiated with a plurality of pulse laser beams, thereby forming pulse-irradiated regions,
wherein each of the pulse-irradiated regions is formed by a single pulse laser beam that corresponds to one of the plurality of the pulse laser beams.

20. The method according to claim 19, wherein the pulse-irradiated regions mean regions that obtain an energy density greater than or equal to 90% of a maximum energy density of the pulse laser beams.

21. The method according to claim 19, wherein the predetermined direction is in parallel with a direction where the pulse-irradiated regions are separated from each other.

22. An apparatus comprising:
a laser light source configured to emit a pulse laser beam at the same repetition rate;
a stage configured to put a layer or a sample on, wherein the layer comprises an insulating surface and a semiconductor layer on the insulating surface; and
a moving device configured to make the stage move;
wherein:
the moving device is switchable between a first operation mode in which the stage is moved at a first speed in modification of semiconductor and a second operation mode in which the stage is moved at a second speed for forming pulse-irradiated regions; and
the second speed is such a speed to form each of the pulse-irradiated regions by a single pulse of the pulse laser beam when irradiating the layer with the pulse laser beam while moving the stage with the moving device.

23. A semiconductor modifying treatment apparatus comprising the apparatus according to claim 22.

24. The apparatus according to claim 22, further comprising a conversion device configured to switch the first operation mode in which a pulse irradiation portion is moved at the first speed in modification of semiconductor and the second operation mode in which the pulse irradiation portion is moved at the second speed for forming pulse-irradiated regions.

* * * * *